(12) United States Patent
Duxbury et al.

(10) Patent No.: US 6,625,025 B1
(45) Date of Patent: Sep. 23, 2003

(54) COMPONENT COOLING IN ELECTRONIC DEVICES

(75) Inventors: Guy A. Duxbury, Nepean (CA); Balwantrai V. Mistry, Nepean (CA); Donald J. Lentz, Ashton (CA)

(73) Assignee: Nortel Networks Limited (CA)

( * ) Notice: Subject to any disclaimer, the term of this patent is extended or adjusted under 35 U.S.C. 154(b) by 0 days.

(21) Appl. No.: 09/901,987

(22) Filed: Jul. 10, 2001

Related U.S. Application Data

(60) Provisional application No. 60/217,154, filed on Jul. 10, 2000.

(51) Int. Cl.[7] ................................................ H05K 7/20
(52) U.S. Cl. .................. 361/704; 165/185; 174/356 C; 257/724; 361/818
(58) Field of Search ..................... 174/35 R, 356 C; 257/722–724; 165/80.3, 185; 361/703, 704, 715, 716, 717–719, 800, 801, 816, 818

(56) References Cited

U.S. PATENT DOCUMENTS

| | | | | |
|---|---|---|---|---|
| 4,133,376 A | * | 1/1979 | Eilenberg | |
| 4,434,541 A | * | 3/1984 | Powers, Jr. | 361/1 |
| 4,755,676 A | * | 7/1988 | Gaalema et al. | 250/352 |
| 4,982,093 A | * | 1/1991 | Voles | |
| 5,175,613 A | * | 12/1992 | Barker, III et al. | 257/713 |
| 5,202,536 A | * | 4/1993 | Buonanno | 174/35 GC |
| 5,504,657 A | * | 4/1996 | Bellino et al. | 361/800 |
| 5,566,055 A | * | 10/1996 | Salvi, Jr. | 361/816 |
| 5,680,410 A | * | 10/1997 | Kim et al. | 372/34 |
| 6,121,545 A | * | 9/2000 | Peng et al. | 174/35 GC |
| 6,281,433 B1 | * | 8/2001 | Decker et al. | 174/35 R |
| 6,331,349 B1 | * | 12/2001 | Kalinoski et al. | 428/220 |

* cited by examiner

*Primary Examiner*—Gerald Tolin
(74) *Attorney, Agent, or Firm*—Steubing McGuinness & Manaras LLP

(57) ABSTRACT

A device for dissipating heat produced by circuitry such as the circuitry associated with an optical transponder includes a plurality of heat dissipating regions. Each heat dissipating region includes a heat sink that is thermally coupled with at least one component. Each heat sink is at least partially thermally isolated from other heat sinks to mitigate heat flow from high-power components to heat sensitive components. Further, all of the heat sinks associated with the circuit package are electrically coupled to provide electromagnetic shielding. A thermally insulative and electrically conductive gasket is employed to couple adjacent heat sinks.

44 Claims, 4 Drawing Sheets

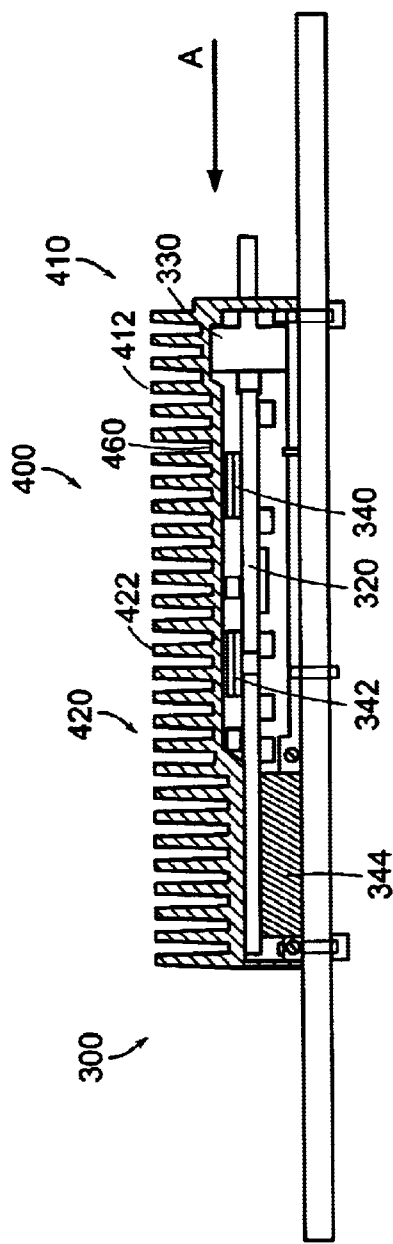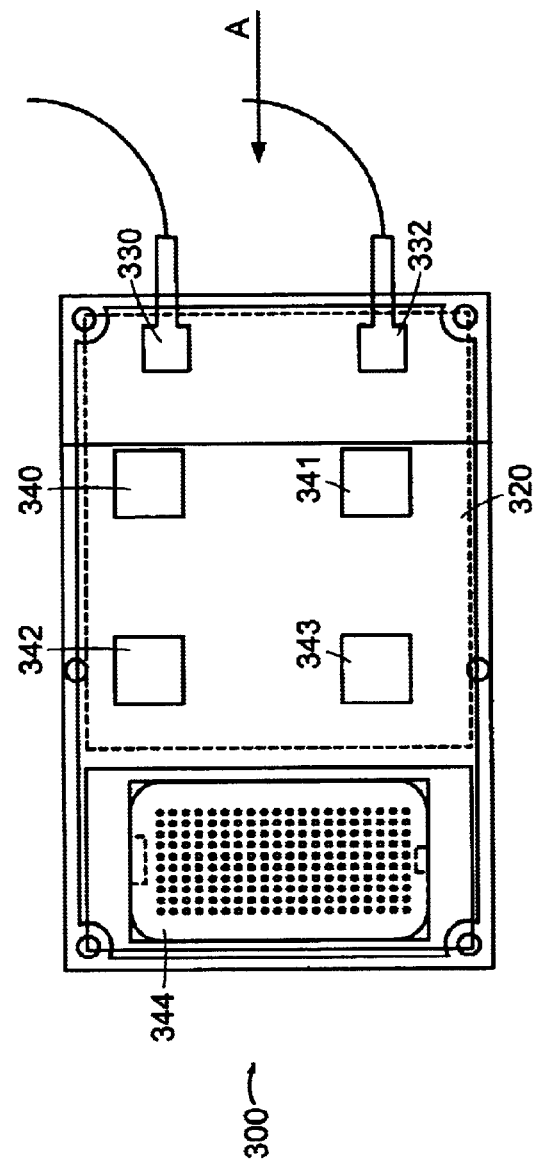

ized as heat. Manufacturers of electronic and optical components typically specify a temperature range within which the components can be expected to operate reliably. Techniques for dissipating heat from components have therefore been developed to facilitate component operation in high-density designs. For example, fans may be employed to increase the flow of air across the surface of devices and components. Further, heat sinks that absorb dissipated heat and increase the surface area over which that heat may be dissipated may be employed.

COMPONENT COOLING IN ELECTRONIC DEVICES

RELATED APPLICATIONS

A claim of priority is made to U.S. Provisional Patent Application Serial No. 60/217,154, entitled IMPROVED LASER COOLING IN OPTICAL TRANSPONDERS, filed on Jul. 10, 2000, which is incorporated by reference herein in its entirety.

FIELD OF THE INVENTION

The present invention is generally related to devices that dissipate heat, and more particularly to heat sinks for electronic and optical devices associated with a high-density architecture.

BACKGROUND OF THE INVENTION

Electronic and optical network communications devices are often made as small as is practicable because of the overhead costs associated with "rack space." Reduction of overall device size may be accomplished in part by increasing the density of components in the device. However, increasing component density results in an increase in the density of energy that must be dissipated from the device as heat. Manufacturers of electronic and optical components typically specify a temperature range within which the components can be expected to operate reliably. Techniques for dissipating heat from components have therefore been developed to facilitate component operation in high-density designs. For example, fans may be employed to increase the flow of air across the surface of devices and components. Further, heat sinks that absorb dissipated heat and increase the surface area over which that heat may be dissipated may be employed.

SUMMARY OF THE INVENTION

In accordance with the present invention, an apparatus for dissipating heat produced by a device includes a plurality of heat-dissipating regions. Each heat-dissipating region is thermally coupled with at least one component associated with the device. For example, each heat-dissipating region may be coupled with one or more integrated circuit packages. Further, each heat-dissipating region is at least partially thermally isolated from other heat-dissipating regions. All of the heat-dissipating regions associated with the circuit package may be electrically coupled.

Thermal isolation of the heat-dissipating regions advantageously mitigates heat flow between different components associated with the device. Different. components associated with the device may generate different amounts of heat. Further, different components associated with the device may have different maximum operating temperatures, i.e., sensitivity to heat. Use of multiple heat-dissipating regions enables individual heat-dissipating regions to be employed with components having particular thermal properties. For example, a heat-dissipating region having greater mass and surface area may be employed with components that are relatively more sensitive to heat or produce relatively greater amounts of heat. Thermal isolation of the heat-dissipating regions associated with the device mitigates heat flow from heat producing components to heat sensitive components.

Electrically coupling the heat-dissipating regions mitigates potential electromagnetic interference from signals generated both inside and outside of the device. The heat-dissipating regions may be formed of an electrically conductive metal that encloses the device on from one to all sides. The electrically conductive metal provides shielding to electromagnetic interference. An electrically conductive and thermally insulative gasket material that couples the heat-dissipating regions further reduces the likelihood of electromagnetic interference by shielding the space between the heat-dissipating regions, and also reduces the likelihood of capacitance buildup between the heat-dissipating regions. The gasket material also allows the heat-dissipating regions to be located in close physical proximity to each other while still providing the benefits noted above.

The present invention is particularly applicable for use with optical transponder devices. Optical transponder devices include a plurality of components such as lasers and silicon based integrated circuits such as multiplexers and demultiplexers. While the performance of both the lasers and the integrated circuits may be adversely affected by high temperatures, the acceptable maximum operating temperature for the lasers is typically lower than that of the integrated circuits. Further, while many electrical and optical circuits generate energy that must be dissipated as heat, the mux/demux integrated circuits associated with the optical transponder may generate an order of magnitude more of such energy in comparison to the lasers. Further, it is desirable to prevent electromagnetic interference from leaking through the transponder enclosure. The present invention mitigates electromagnetic interference and the likelihood of heat generated by the integrated circuits increasing the temperature of the lasers beyond the maximum operating temperature by employing a first heat dissipating region in conjunction with the lasers and a second heat-dissipating region in conjunction with the integrated circuits. In particular, when an air-cooled optical transponder has a plurality of components, including a temperature sensitive component such as an uncooled laser, along with other power generating but less temperature sensitive components such as a laser driver or multiplexer silicon chip, separate heat dissipation elements are employed with the components. One embodiment of the invention is an optical transponder where there is a first heatsink element thermally connected to the laser and pin/tz optical components and a second heatsink used to cool all other power consuming components including any AGC circuits, Clock and data recovery devices, demultiplexers, multiplexers, laser drivers and monitoring and control circuits. These two heatsinks are connected using an electrically conductive but thermally isolating layer so that electromagnetic interference is contained but minimal heat is transferred therebetween. Air is driven to cool the optical transponder from the end where the laser and pin diodes are located.

Certain embodiments of the invention provide a heat dissipating device for use with a circuit package having a plurality of components. The device includes a first thermally conductive portion for thermally coupling with a first component of the circuit package, a second thermally conductive portion for thermally coupling with a second component of the circuit package and an electrically conductive and thermally insulative material. The electrically conductive and thermally insulative material connects to the first and second thermally conductive portions such that the first thermally conductive portion is substantially thermally isolated from the second thermally conductive portion.

Certain embodiments of the invention provide a circuit package having first and second components and first and second thermally conductive portions attached to and thermally coupled with the first and second components, respectively. The circuit package also includes an electrically conductive and thermally insulative material coupled with the first and second thermally conductive portion such that the first thermally conductive portion is substantially thermally isolated from the second thermally conductive portion.

Certain embodiments of the invention provide a method for dissipating heat from the circuit package. The method includes dissipating from a first component of the circuit package to a first thermally conductive portion and dissipating from a second component of the circuit package to a second thermally conductive portion and connecting the first thermally conductive portion to the second thermally conductive portion by an electrically conductive and thermally insulative material.

Other aspects and features of the present invention will become apparent to those ordinarily skilled in the art upon review of the following description of specific embodiments of the invention in conjunction with the accompanying figures.

BRIEF DESCRIPTION OF THE DRAWING FIGURES

The invention will be more fully understood from the following Detailed Description of Preferred Embodiments and the following drawing figures, which should not be construed as limiting, but are intended to be exemplary only, and of which:

FIG. 2 is a diagram illustrating a layout of an optical transponder;

FIG. 3 is a cross-sectional diagram illustrating coupling of the multi-region heat dissipating device with the optical transponder of FIG. 2;

DETAILED DESCRIPTION OF PREFERRED EMBODIMENTS

The invention presents a new combination of elements, as well as incorporates new configurations for those elements, which in sum compliment one another in such a way to provide a new, useful and non-obvious improvement over prior art component cooling. The invention is not limited to the particular structures disclosed herein. Rather, as a natural consequence of reading this specification, other component cooling executions within the purview of the present invention will become readily apparent to those skilled in the art of component cooling.

Figure 1:
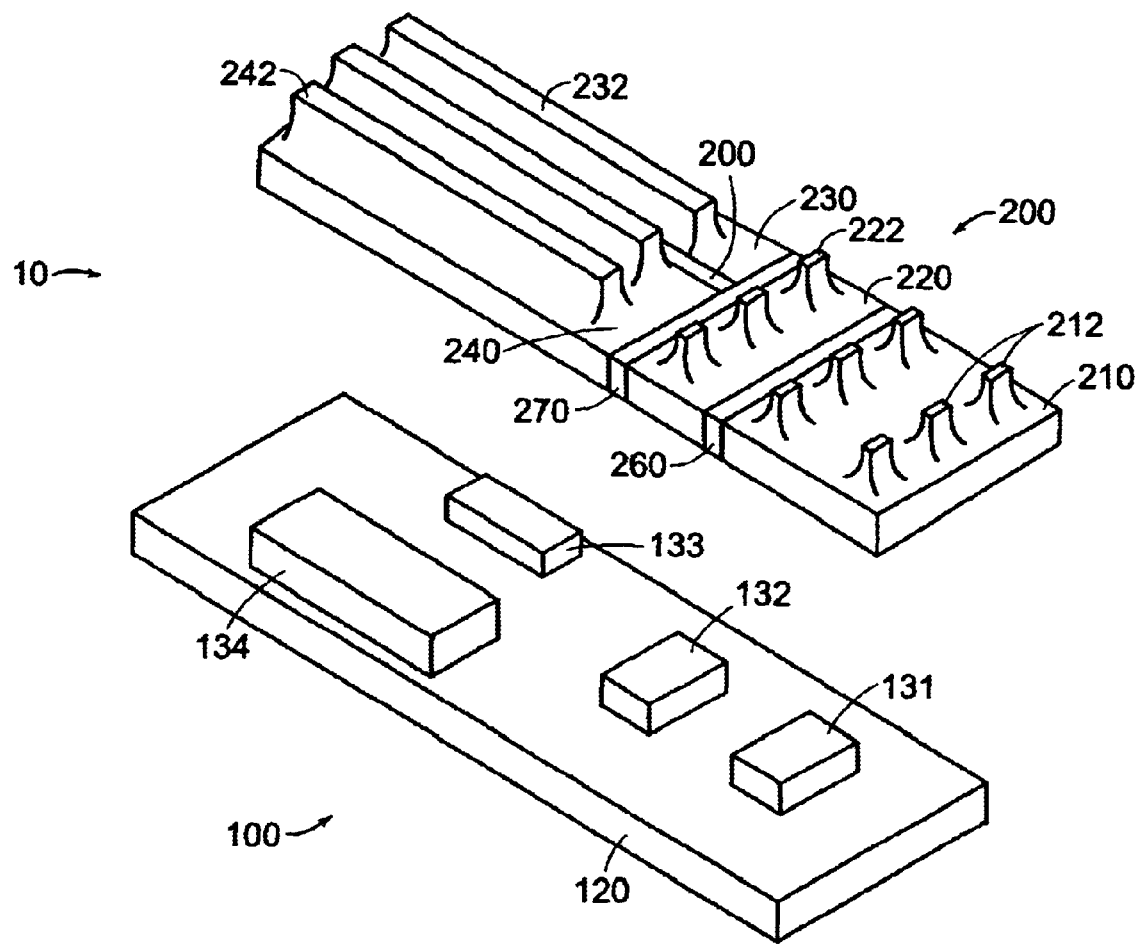
FIG. 1 is a diagram of a multi-region heat dissipating device coupled with circuitry in accordance with an embodiment of the present invention.

FIG. 1 illustrates a circuit package 10 having a multi-region heat dissipating device 200 coupled with circuitry 100. Circuitry 100 includes a plurality of integrated circuit packages 131, 132, 133, 134 mounted on a printed circuit board 120. Each integrated circuit package 131, 132, 133, 134 is thermally coupled with a separate heat dissipating zone 210, 220, 230, 240, having heat dissipating elements, 212, 222, 232, 242, respectively. Each heat dissipating zone is partially thermally isolated from the other heat dissipating zones, thereby providing a distinct heat dissipating region. It should be noted that although the use of integrated circuit packages is illustrated, other components such as power supplies, transformers, and passive components that are housed in packages unlike those of the illustrated integrated circuits could be coupled with heat dissipating zones.

The heat dissipating zones 210, 220, 230, 240 can be heat sinks that are constructed of a thermally and electrically conductive material such as a metal or metal alloy. For example, the heat sinks may be constructed from aluminum, copper or alloys thereof. Each heat sink, or heat dissipating zone, is thermally coupled with its corresponding integrated circuit. The heat sink and corresponding integrated circuit may be thermally coupled by securing the heat sink in direct contact with the surface of the integrated circuit package. Alternatively, a thermally conductive paste or adhesive may be disposed between the heat sink and the surface of the integrated circuit package.

Each heat sink is matched to its corresponding integrated circuit by mass and shape. For example, a heat dissipating region having greater mass and surface area may be employed with components that are particularly sensitive to high temperature or that generate relatively large amounts of heat.

Each heat sink is at least partially thermally isolated from other heat sinks. For example, a thermally insulative gasket can be disposed between adjacent heat sinks. The thermally insulative gasket can be constructed from a material, such as CHO-SEAL® or Cho-Form® (Chomerics, Division of Parker Hannifer Corporation), which is both thermally insulative and electrically conductive. The thermally insulative gasket reduces flow of heat between the heat sinks. Consequently, heat flow from heat producing integrated circuits to heat sensitive integrated circuits is reduced. FIG. 1 shows thermally insulative gasket 260 between heat dissipating zones 210 and 220 thermally insulative gasket 270 between heat dissipating zone 220 and heat dissipating zones 230 and 240, and thermally insulative gasket 280 between heat dissipating zones 230 and 240.

The heat sinks are electrically coupled by the thermally insulative gaskets. In particular, contact between the electrically conductive gaskets and adjacent heat sinks forms a relatively low impedance path between each of the heat sinks associated with the circuit package. Electrically coupling the heat sinks mitigates the possibility of electromagnetic interference either entering or exiting the circuit package. The electrically conductive metal or metal alloy of which the heat sinks are constructed provides shielding to electromagnetic interference. Further, the gasket material that couples the heat sinks reduces the likelihood of electromagnetic interference transiting the region between heat sinks by shielding that space. The low impedance path also reduces the likelihood of capacitance buildup between the heat dissipating zones.

Depending on the particular design constraints imposed by the heat generation and heat vulnerability of the components involved, certain other materials may be appropriate for use between the heat sinks. For example, a piece of stainless steel placed between the heat sinks may provide a sufficient thermal barrier while also providing a sufficient electrical connection. Other materials that have sufficient electrical conductivity and are, at the same time, sufficiently thermally insulating can also be used.

FIGS. 2 and 3 illustrate an example of an optical transponder 300 that employs the heat dissipating technique of the present invention. Optical transponder 300 includes a plurality of components such as a laser 330 and a Pin/Tz 332 and silicon based integrated circuits such as laser driver 340, Rx amp 341, multiplexer 342 and demultiplexer 343. Optical transponder 300 also includes a mated Berg Meg-array 344 mounted to a printed circuit board 320. While the performance of the laser, Pin/Tz and the integrated circuits may be adversely affected by high temperatures, the acceptable maximum operating temperatures for the laser and Pin/Tz are typically lower than those of the integrated circuits. Further, while many electrical and optical circuits generate energy that must be dissipated as heat, the multiplexer/demultiplexer integrated circuits 342, 343 may generate an order of magnitude more of such energy in comparison to laser 330 and Pin/Tz 332. In order to minimize heat transfer from the multiplexer/demultiplexer integrated circuits to the laser and Pin/Tz, separate heat sinks are supplied.

As shown in FIG. 3, a first heat sink 410 is provided to dissipate heat from laser 330 and Pin/Tz 332. A second heat sink 420 is provided to dissipate heat from laser driver 340, Rx amp 341, multiplexer 342, demultiplexer 343 and array 344. While first heat sink 410 and second heat sink 420 make up a heat dissipating device 400, first heat sink 410 and second heat sink 420 are separated by a thermally insulative gasket 460. Thermally insulative gasket 460 reduces or eliminates heat transfer from second heat sink 420 to first heat sink 410 and, therefore, heat transfer from devices 340–344 to the more temperature sensitive devices 330 and 332.

First heat sink 410 and second heat sink 420 are shown having heat dissipating elements 412 and 422, respectively. Heat dissipating elements 412 and 422 are just one example of heat dissipating elements of the invention.

Preferred embodiments of the invention include driving air over heat dissipating device 400 in order to increase the amount of heat dissipated from heat dissipating device 400 and, therefore, optical transponder 300. Arrow A shown in FIGS. 2 and 3 indicates a direction of airflow that would cause cooling air to pass over first heat sink 410 and then second heat sink 420. By driving the cooling air first over the heat sink associated with the more temperature sensitive parts before the heat sink associated with the less temperature sensitive parts improves the temperature characteristics of the optical transponder.

In preferred embodiments, thermally insulative gasket 460 is made of a material that is electrically conductive but thermally insulative so that electromagnetic interferences are contained but heat is not significantly transferred between the heat sinks 410 and 420. As discussed above, electrically coupling the heat sinks reduces the possibility of electromagnetic interference either entering or exiting the circuit package.

Figure 4:
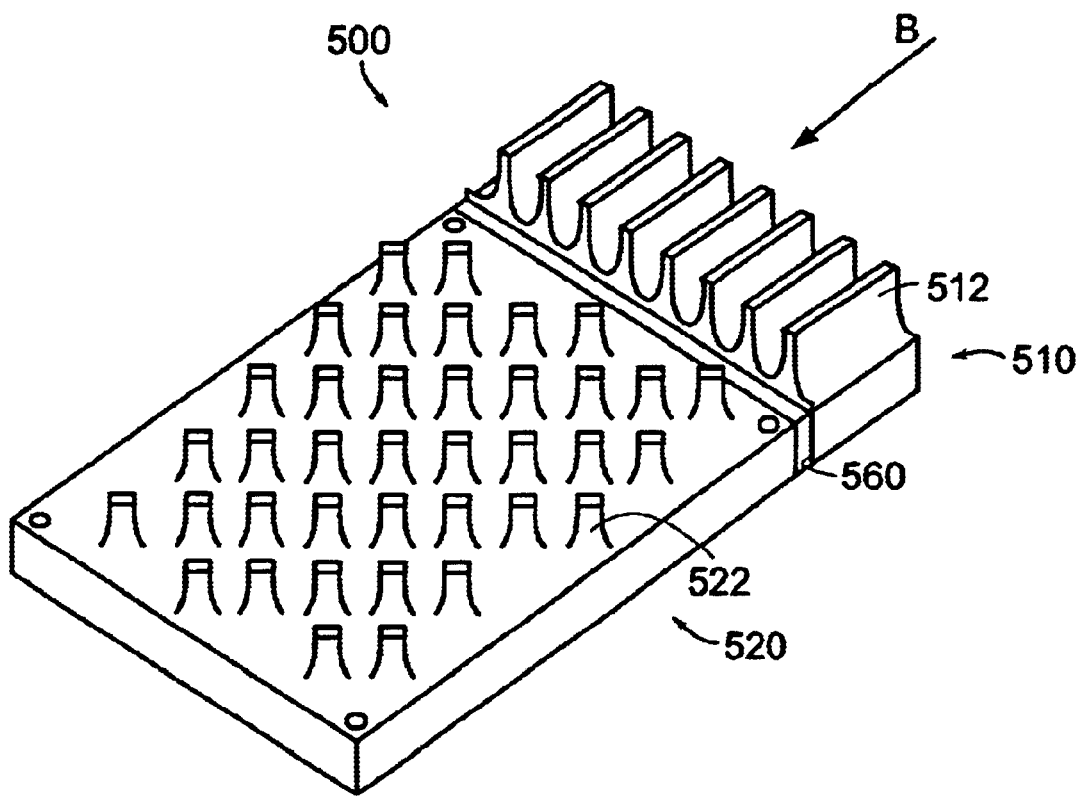
FIG. 4 is a perspective view of a heat dissipating device in accordance with an embodiment of the invention.

FIG. 4 is a perspective view of one embodiment of the invention. In FIG. 4, the heat dissipating device 500 has a first heat dissipating zone 510, a second heat dissipating zone 520 and an electrically conductive and thermally insulative material 560. In the example shown in FIG. 4, first heat dissipating zone 510 has heat dissipating elements 512 that are fin shaped and run parallel to cooling air flow direction B. Second heat dissipating zone 520 has heat dissipating elements 522 that are pin shaped. The relative size and shape of the heat dissipating elements used in the heat sinks can be changed to provide the appropriate heat dissipation required by a particular circuit or device. Although fin shaped and pin shaped heat dissipating elements are shown in FIG. 4, any appropriate shape element can be used.

Figure 5:
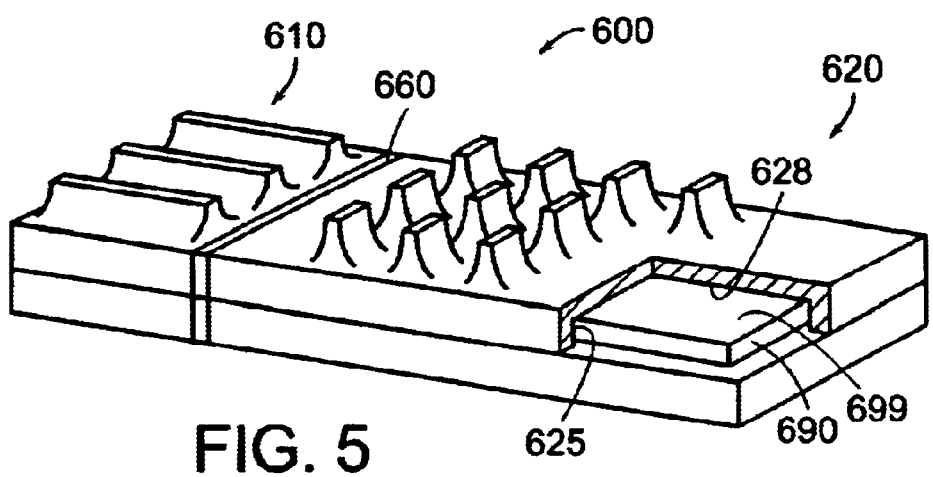
FIG. 5 is a sectional view of an embodiment of the invention.

FIG. 5 shows a heat dissipating device 600 of a preferred embodiment of the invention. Heat dissipating device 600 includes first heat dissipating zone 610, second heat dissipating zone 620 and electrically conductive and thermally insulative material 660. In FIG. 5, a portion of second heat dissipating zone 620 is cut away to show circuit element 690 which is cooled by second heat dissipating zone 620. In this embodiment, circuit element 690 fits inside a cavity 625 in second heat dissipating zone 620 such that an upper surface 699 of circuit element 690 contacts an upper surface 628 of cavity 625. The contact between upper surface 699 of circuit element 690 and upper surface 628 of cavity 625 promotes heat transfer from circuit element 690 to second heat dissipating zone 620. This contact can be through direct contact or through a thermally conductive past or adhesive.

Figure 6:
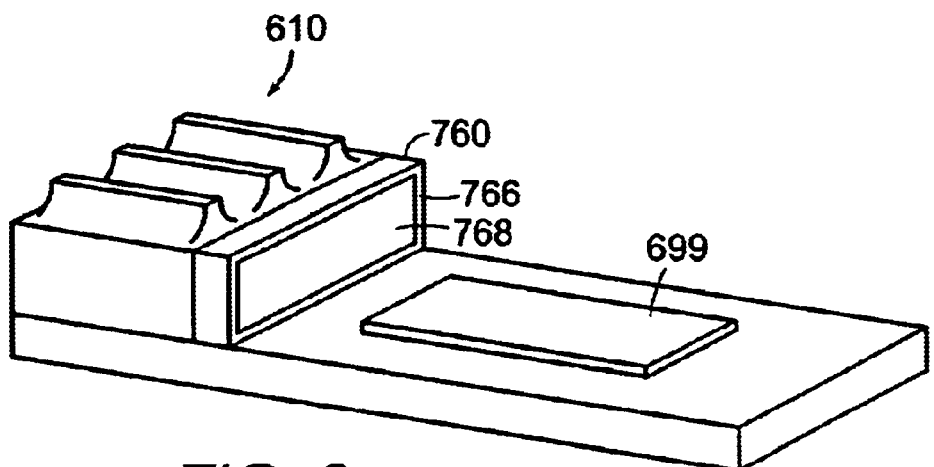
FIG. 6 is a partial view of an alternate embodiment of the invention.
Figure 7:
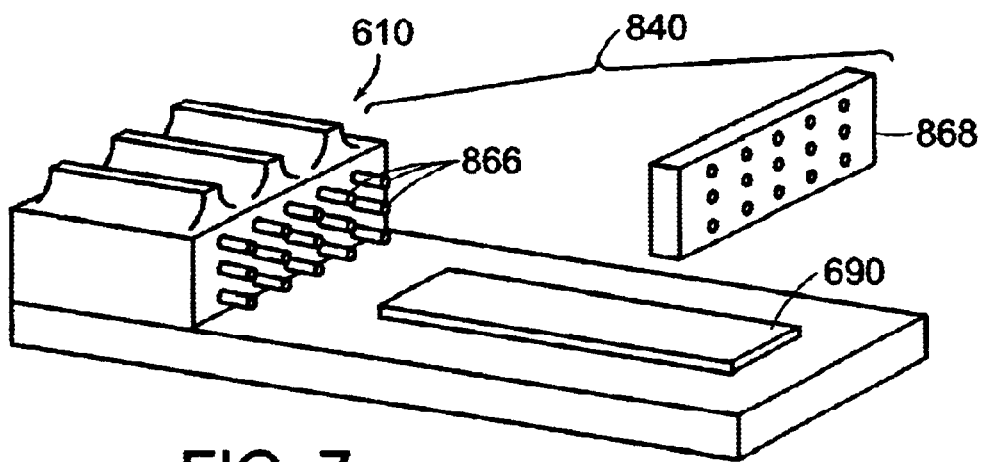
FIG. 7 is a partial view of another alternate embodiment of the invention.

FIGS. 6 and 7 show examples of alternate embodiments of the invention shown in FIG. 5. In FIGS. 6 and 7, electrically conductive and thermally insulative material 660 is replaced by electrically conductive and thermally insulative portions 760 and 860, respectively. Both portions 760 and 860 comprise an electrically conductive portion and a thermally insulative portion. The contact area between the heat dissipating zones and the electrically conductive portion is preferably limited to that which is necessary to sufficiently electrically connect the heat dissipating zones to each other so that the transfer of heat between the heat dissipating zones is minimized. The balance of space between the heat dissipating zones not occupied by the electrically conductive portion is preferably filled with the thermally insulative portion to further reduce heat transfer from one heat dissipating zone to the other.

In FIG. 6, the space between first heat dissipating zone 610 and second heat dissipating zone 620 (omitted for clarity) is filled by electrically conductive and thermally insulative portion 760. Electrically conductive and thermally insulative portion 760 comprises electrically conductive portion 766 and thermally insulative portion 768. In this example, thermally insulative portion 768 has a much larger surface area in contact with first and second heat dissipating zones 610, 620 than does electrically conductive portion 766. Examples of materials that are preferable for use in thermally insulative portion 768 include fiberglass and printed circuit board. However, any appropriate thermally insulative material may be used. Examples of materials that are preferable for use in electrically conductive portion 766 include highly electrically conductive metals and other highly electrically conductive materials. In the example shown in FIG. 6, electrically conductive portion 766 is a very thin plating applied to the edge of thermally insulative portion 768.

In FIG. 7, the space between first heat dissipating zone 610 and second heat dissipating zone 620 (omitted for clarity) is filled by electrically conductive and thermally insulative portion 860. Electrically conductive and thermally insulative portion 860 comprises electrically conductive portions 866 and thermally insulative portion 868. In this example, thermally insulative portion 868 has a much larger surface area in contact with first and second heat dissipating zones 610, 620 than do electrically conductive portions 866. An example of materials that are preferable for use in thermally insulative portion 868 include rubber. However, any appropriate thermally insulative material may be used. Examples of materials that are preferable for use in electrically conductive portions 866 include highly electrically conductive metals and other highly electrically conductive materials. In the example shown in FIG. 7, electrically conductive portions 866 are small metal rods that contact heat dissipating zones 610 and 620. Electrically conductive portions 866 can be formed separately from one or both of heat dissipating zones 610 and 620 or can be an integral part of one or both of heat dissipating zones 610 and 620. In alternate embodiments, first heat dissipating zone 610, electrically conductive portions 866 and second heat dissipating zone 620 can be formed as one piece of metal with thermally insulative portion 868 being added later, possibly in liquid form, so as to substantially fill the space between the heat dissipating zones that is not occupied by electrically conductive portions 866.

The invention has been described in connection with preferred embodiments. These embodiments are intended to be illustrative only. Variations, modifications and different applications of the invention taught in the Detailed Description and drawings will be apparent to those skilled in the art. Accordingly, it should be understood that other embodiments of the invention might be practiced without departing from the spirit and scope of the invention.

What is claimed is:

1. A heat dissipating device for use with a circuit package having a plurality of components, comprising:
   a first heat dissipating portion for thermally coupling with a first component of the circuit package;
   a second heat dissipating portion for thermally coupling with a second component of the circuit package; and
   an electrically conductive and thermally insulative portion connected to the first and second heat dissipating portions such that the first heat dissipating portion is electrically connected to and substantially completely thermally isolated from the second heat dissipating portion.

2. The heat dissipating device of claim 1, wherein the electrically conductive and thermally insulative portion is made of a material selected from the group including CHO-SEAL® and Cho-Form®.

3. The heat dissipating device of claim 1, wherein the first and second heat dissipating portions are constructed of a material selected from the group including aluminum, alloys containing aluminum, copper and alloys containing copper.

4. The heat dissipating device of claim 1, wherein the first and second heat dissipating portions include pin shaped elements.

5. The heat dissipating device of claim 1, wherein the first heat dissipating portion dissipates head at a first rate, and wherein the second heat dissipating portion dissipates heat at a second rate, and wherein the first rate is greater than the second rate during operation.

6. The heat-dissipating device of claim 5, wherein the second heat dissipating portion comprises a heat dissipating portion for thermally coupling with a laser.

7. The heat-dissipating device of claim 1, wherein the second heat dissipating portion comprises a heat dissipating portion for thermally coupling with a laser.

8. The heat-dissipating device of claim 1, wherein the first heat dissipating portion has a cavity adapted to receive the first component.

9. The heat-dissipating device of claim 8, wherein the second heat dissipating portion has a cavity adapted to receive the second component.

10. The heat-dissipating device of claim 1, wherein the electrically conductive and thermally insulative portion fills a gap between the first and second heat dissipating portions.

11. The heat-dissipating device of claim 1, wherein the first and second heat dissipating portions are heat sinks.

12. The heat-dissipating device of claim 1, wherein the electrically conductive and thermally insulative portion comprises
an electrically conductive portion connected to the first and second heat dissipating portions; and
a thermally insulative portion.

13. The heat-dissipating device of claim 12, wherein the electrically conductive portion is located along a perimeter of the thermally insulative portion.

14. The heat-dissipating device of claim 13, wherein the electrically conductive portion is a plating applied to an edge of the thermally insulative portion.

15. The heat-dissipating device of claim 12, wherein the electrically conductive portion is at least one physical connection between the first and second heat dissipating portions.

16. The heat-dissipating device of claim 15, wherein the thermally insulative portion occupies at least a portion of a space between the first and second heat dissipating portions.

17. A circuit package, comprising:
   a first component;
   a first heat dissipating portion attached to and thermally coupled with the first component;
   a second component;
   a second heat dissipating portion attached to and thermally coupled with the second component; and
   an electrically conductive and thermally insulative portion coupled with the first and second heat dissipating portions such that the first heat dissipating portion is electrically connected to and substantially completely thermally isolated from the second heat dissipating portion.

18. The circuit package of claim 17, wherein the electrically conductive and thermally insulative portion is made of a material selected from the group including CHO-SEAL® and Cho-Form®.

19. The circuit package of claim 17, wherein the first and second heat dissipating portions are constructed of a material selected from the group including aluminum, alloys containing aluminum, copper and alloys containing copper.

20. The circuit package of claim 17, wherein the first and second heat dissipating portions include pin shaped elements.

21. The circuit package of claim 17, wherein the first component and second component dissipate heat, and wherein the first component dissipates more heat than the second component during operation.

22. The circuit package of claim 21, further comprising an air mover that moves air such that the air is moved over the second heat dissipating portion before the air is moved over the first heat dissipating portion.

23. The circuit package of claim 17, wherein the second component comprises a laser.

24. The circuit package of claim 17, wherein the first heat dissipating portion has a cavity that receives the first component.

25. The circuit package of claim 24, wherein the second heat dissipating portion has a cavity that receives the second component.

26. The circuit package of claim 17, wherein the second heat dissipating portion has a cavity that receives the second component.

27. The circuit package of claim 17, wherein the electrically conductive and thermally insulative portion fills a gap between the first and second heat dissipating portions.

28. The circuit package of claim 17, wherein the first and second heat dissipating portions are heat sinks.

29. The circuit package of claim 17, wherein the electrically conductive and thermally insulative portion comprises an electrically conductive portion connected to the first and second heat dissipating portions; and a thermally insulative portion.

30. The circuit package of claim 29, wherein the electrically conductive portion is located along a perimeter of the thermally insulative portion.

31. The circuit package of claim 30, wherein the electrically conductive portion is a plating applied to an edge of the thermally insulative portion.

32. The circuit package of claim 29, wherein the electrically conductive portion is at least one physical connection between the first and second heat dissipating portions.

33. The circuit package of claim 32, wherein the thermally insulative portion occupies at least a portion of a space between the first and second heat dissipating portions.

34. A method for dissipating heat from a circuit package, comprising:

dissipating heat from a first component of the circuit package to a first heat dissipating portion; and dissipating heat from a second component of the circuit package to a second heat dissipating portion, wherein the first and second heat dissipating portions are connected by an electrically conductive and thermally insulative portion such that the first heat dissipating portion is electrically connected to and substantially completely thermally isolated from the second heat dissipating portion.

35. The method of claim 34, wherein the first heat dissipating portion dissipates heat at a first rate, and the second heat dissipating portion dissipates heat at a second rate, and wherein the first rate is greater than the second rate.

36. The method of claim 35, further comprising moving air such that the air is moved over the second heat dissipating portion before the air is moved over the first heat dissipating portion.

37. The method of claim 34, wherein the electrically conductive and thermally insulative portion fills a gap between the first and second heat-dissipating portions.

38. The method of claim 34, wherein the first and second heat dissipating portions are heat sinks.

39. The method of claim 34, wherein the second component comprises a laser.

40. The method of claim 34, wherein the electrically conductive and thermally insulative portion comprises an electrically conductive portion connected to the first and second heat dissipating portions; and a thermally insulative portion.

41. The method of claim 40, wherein the electrically conductive portion is located along a perimeter of the thermally insulative portion.

42. The method of claim 41, wherein the electrically conductive portion is a plating applied to an edge of the thermally insulative portion.

43. The method of claim 40, wherein the electrically conductive portion is at least one physical connection between the first and second heat dissipating portions.

44. The method of claim 43, wherein the thermally insulative portion occupies at least a portion of a space between the first and second heat dissipating portions.

* * * * *